US008773108B2

(12) United States Patent  
Curt et al.

(10) Patent No.: US 8,773,108 B2  
(45) Date of Patent: Jul. 8, 2014

(54) SYSTEM, METHOD, AND APPARATUS FOR A SAFE POWERLINE COMMUNICATIONS INSTRUMENTATION FRONT-END

(75) Inventors: Walter Curt, Harrisonburg, VA (US); Christopher Mullins, Penn Laird, VA (US)

(73) Assignee: Power Monitors, Inc., Mt. Crawford, VA (US)

( * ) Notice: Subject to any disclaimer, the term of this patent is extended or adjusted under 35 U.S.C. 154(b) by 552 days.

(21) Appl. No.: 12/943,493

(22) Filed: Nov. 10, 2010

(65) Prior Publication Data

US 2011/0109320 A1    May 12, 2011

Related U.S. Application Data

(60) Provisional application No. 61/259,855, filed on Nov. 10, 2009.

(51) Int. Cl.  
*G01R 19/00*    (2006.01)

(52) U.S. Cl.  
USPC ..................................................... 324/76.11

(58) Field of Classification Search  
None  
See application file for complete search history.

(56) References Cited

U.S. PATENT DOCUMENTS

| | | | |
|---|---|---|---|
| 2,855,916 A | 10/1958 | Foster | |
| 3,516,063 A | 6/1970 | Arkin et al. | |
| 3,710,252 A * | 1/1973 | Till | 324/126 |
| 4,067,054 A | 1/1978 | Clark | |
| 4,540,182 A | 9/1985 | Clement | |
| 4,558,275 A | 12/1985 | Borowy et al. | |
| 4,731,574 A | 3/1988 | Melbert | |
| 4,731,575 A | 3/1988 | Sloan | |
| 4,800,492 A | 1/1989 | Johnson et al. | |
| 5,083,638 A | 1/1992 | Schneider | |
| 5,107,202 A | 4/1992 | Renda | |
| 5,241,283 A | 8/1993 | Sutterlin | |
| 5,410,735 A | 4/1995 | Borchardt et al. | |
| 5,420,799 A | 5/1995 | Peterson et al. | |
| 5,488,202 A | 1/1996 | Baitz et al. | |
| 5,491,463 A | 2/1996 | Sargeant et al. | |
| 5,565,783 A | 10/1996 | Lau et al. | |
| 5,583,801 A | 12/1996 | Croyle et al. | |
| 5,602,794 A | 2/1997 | Javanifard et al. | |
| 5,617,286 A | 4/1997 | Jenkins | |
| 5,641,898 A | 6/1997 | Chang | |

(Continued)

FOREIGN PATENT DOCUMENTS

| | | |
|---|---|---|
| CN | 2765183 Y | 3/2006 |
| DE | 102007026290 | 7/2008 |

(Continued)

OTHER PUBLICATIONS

Chinese Office Action issued on Jul. 6, 2010 Chinese Patent Appl. No. 200780015356.0 (10 pages).

(Continued)

*Primary Examiner* — Vinh Nguyen  
(74) *Attorney, Agent, or Firm* — Dinsmore & Shohl LLP

(57) ABSTRACT

A safe powerline communications instrumentation front end device including a voltage input for receiving a line voltage from a powerline, a voltage reducer for reducing the voltage of the line voltage, a filtering system for extracting a Power Line Communications (PLC) signal from the line voltage, and an analog output for outputting the PLC signal as an analog signal for communications test equipment.

10 Claims, 9 Drawing Sheets

(56) References Cited

U.S. PATENT DOCUMENTS

| | | |
|---|---|---|
| 5,659,453 A | 8/1997 | Russell et al. |
| 5,725,062 A | 3/1998 | Fronek |
| 5,726,646 A | 3/1998 | Bane et al. |
| 5,732,039 A | 3/1998 | Javanifard et al. |
| 5,752,046 A | 5/1998 | Oprescu et al. |
| 5,767,735 A | 6/1998 | Javanifard et al. |
| 5,781,473 A | 7/1998 | Javanifard et al. |
| 5,796,631 A | 8/1998 | Iancu et al. |
| 5,831,538 A | 11/1998 | Schena |
| 5,898,158 A | 4/1999 | Shimizu et al. |
| 5,905,616 A | 5/1999 | Lyke |
| 5,937,386 A | 8/1999 | Frantz |
| 5,939,974 A | 8/1999 | Heagle et al. |
| 5,943,226 A | 8/1999 | Kim |
| 6,005,758 A | 12/1999 | Spencer et al. |
| 6,022,315 A | 2/2000 | Iliff |
| 6,034,859 A | 3/2000 | Baumgärtl |
| 6,049,880 A | 4/2000 | Song |
| 6,091,337 A | 7/2000 | Arshad et al. |
| 6,107,862 A | 8/2000 | Mukainakano et al. |
| 6,115,695 A | 9/2000 | Kern |
| 6,151,229 A | 11/2000 | Taub et al. |
| 6,169,406 B1 | 1/2001 | Peschel |
| 6,212,049 B1 | 4/2001 | Spencer et al. |
| 6,222,443 B1 | 4/2001 | Beeson et al. |
| 6,307,425 B1 | 10/2001 | Chevallier et al. |
| 6,313,394 B1 | 11/2001 | Shugar et al. |
| 6,317,031 B1 | 11/2001 | Rickard |
| 6,356,426 B1 | 3/2002 | Dougherty |
| 6,360,177 B1 | 3/2002 | Curt et al. |
| 6,369,642 B1 | 4/2002 | Zeng |
| 6,384,348 B1 | 5/2002 | Haga et al. |
| 6,415,244 B1 | 7/2002 | Dickens et al. |
| 6,437,692 B1 | 8/2002 | Petite et al. |
| 6,545,482 B1 | 4/2003 | Fedirchuk et al. |
| 6,545,529 B2 | 4/2003 | Kim |
| 6,603,218 B1 | 8/2003 | Aisa |
| 6,628,496 B2 | 9/2003 | Montjean |
| 6,633,163 B2 | 10/2003 | Fling |
| 6,633,823 B2 | 10/2003 | Bartone et al. |
| 6,647,024 B1 | 11/2003 | Dombkowski et al. |
| 6,653,945 B2 | 11/2003 | Johnson et al. |
| 6,687,680 B1 | 2/2004 | Iguchi et al. |
| 6,690,594 B2 | 2/2004 | Amarillas et al. |
| 6,704,568 B2 | 3/2004 | Montjean |
| 6,734,682 B2 | 5/2004 | Tallman et al. |
| 6,789,206 B1 | 9/2004 | Wierzbicki et al. |
| 6,792,337 B2 | 9/2004 | Blackett et al. |
| 6,836,099 B1 | 12/2004 | Amarillas et al. |
| 6,842,719 B1 | 1/2005 | Fitzpatrick et al. |
| 6,866,193 B1 | 3/2005 | Shimizu et al. |
| 6,912,678 B1 | 6/2005 | Floro et al. |
| 6,928,564 B2 | 8/2005 | Tada et al. |
| 6,931,445 B2 | 8/2005 | Davis |
| 6,944,058 B2 | 9/2005 | Wong |
| 6,957,158 B1 | 10/2005 | Hancock et al. |
| 6,961,641 B1 | 11/2005 | Forth et al. |
| 6,993,417 B2 | 1/2006 | Osann, Jr. |
| 6,995,603 B2 | 2/2006 | Chen et al. |
| 7,004,784 B2 | 2/2006 | Castle |
| 7,009,379 B2 | 3/2006 | Ramirez |
| 7,130,722 B2 | 10/2006 | Soni |
| 7,135,850 B2 | 11/2006 | Ramirez |
| 7,177,824 B2 | 2/2007 | Sabongi et al. |
| 7,242,109 B2 | 7/2007 | Beeren |
| 7,348,769 B2 | 3/2008 | Ramirez |
| 7,460,467 B1 | 12/2008 | Corcoran |
| 7,462,952 B2 | 12/2008 | Bailey |
| 7,769,149 B2 | 8/2010 | Berkman |
| 7,795,877 B2 | 9/2010 | Radtke et al. |
| 7,804,280 B2 | 9/2010 | Deaver, Sr. et al. |
| 7,956,673 B2 | 6/2011 | Pan |
| 7,962,298 B2 * | 6/2011 | Przydatek et al. ............ 702/61 |
| 7,982,596 B2 * | 7/2011 | Curt et al. .................... 340/514 |
| 8,228,924 B2 * | 7/2012 | Dawson et al. ............... 370/401 |
| 2002/0008566 A1 | 1/2002 | Taito et al. |
| 2002/0043969 A1 | 4/2002 | Duncan et al. |
| 2002/0063635 A1 | 5/2002 | Shincovich |
| 2002/0082924 A1 | 6/2002 | Koether |
| 2002/0112250 A1 | 8/2002 | Koplar et al. |
| 2002/0130701 A1 | 9/2002 | Kleveland |
| 2002/0143482 A1 | 10/2002 | Karanam et al. |
| 2002/0182570 A1 | 12/2002 | Croteau et al. |
| 2003/0046377 A1 | 3/2003 | Daum et al. |
| 2003/0069796 A1 | 4/2003 | Elwood et al. |
| 2003/0126735 A1 | 7/2003 | Taniguchi et al. |
| 2003/0167178 A1 | 9/2003 | Jarman et al. |
| 2003/0197989 A1 | 10/2003 | Nojima |
| 2003/0224784 A1 | 12/2003 | Hunt et al. |
| 2003/0225713 A1 | 12/2003 | Atkinson et al. |
| 2004/0008023 A1 | 1/2004 | Jang et al. |
| 2004/0024913 A1 | 2/2004 | Ikeda et al. |
| 2004/0124247 A1 | 7/2004 | Watters |
| 2004/0128085 A1 | 7/2004 | Ramirez |
| 2004/0138786 A1 | 7/2004 | Blackett et al. |
| 2004/0138835 A1 | 7/2004 | Ransom et al. |
| 2004/0210621 A1 | 10/2004 | Antonellis |
| 2004/0242087 A1 | 12/2004 | Hoshina |
| 2005/0049921 A1 | 3/2005 | Tengler et al. |
| 2005/0052186 A1 | 3/2005 | Grube |
| 2005/0138432 A1 | 6/2005 | Ransom et al. |
| 2005/0144099 A1 | 6/2005 | Deb et al. |
| 2005/0154490 A1 | 7/2005 | Blaine et al. |
| 2005/0154499 A1 | 7/2005 | Aldridge et al. |
| 2005/0212526 A1 | 9/2005 | Blades |
| 2005/0216349 A1 | 9/2005 | Vaseloff et al. |
| 2005/0256774 A1 | 11/2005 | Clothier et al. |
| 2005/0273183 A1 | 12/2005 | Curt et al. |
| 2006/0047543 A1 | 3/2006 | Moses |
| 2006/0061480 A1 | 3/2006 | Bowman |
| 2006/0062400 A1 | 3/2006 | Chia-Chun |
| 2006/0071776 A1 | 4/2006 | White, II et al. |
| 2006/0087322 A1 | 4/2006 | McCollough, Jr. |
| 2006/0087783 A1 | 4/2006 | Holley |
| 2006/0098371 A1 | 5/2006 | Wambsganss et al. |
| 2006/0111040 A1 | 5/2006 | Jenkins et al. |
| 2006/0114121 A1 | 6/2006 | Cumeralto et al. |
| 2006/0145685 A1 | 7/2006 | Ramirez |
| 2006/0158177 A1 | 7/2006 | Ramirez |
| 2006/0176630 A1 | 8/2006 | Carlino et al. |
| 2006/0181838 A1 | 8/2006 | Ely |
| 2006/0190140 A1 | 8/2006 | Soni |
| 2006/0190209 A1 | 8/2006 | Odom |
| 2006/0218057 A1 | 9/2006 | Fitzpatrick et al. |
| 2006/0244518 A1 | 11/2006 | Byeon et al. |
| 2006/0271244 A1 | 11/2006 | Cumming et al. |
| 2006/0271314 A1 | 11/2006 | Hayes |
| 2007/0010916 A1 | 1/2007 | Rodgers et al. |
| 2007/0053216 A1 | 3/2007 | Alenin |
| 2007/0064622 A1 | 3/2007 | Bi et al. |
| 2007/0080819 A1 | 4/2007 | Marks et al. |
| 2007/0114987 A1 * | 5/2007 | Kagan ........................ 324/142 |
| 2007/0126569 A1 | 6/2007 | Dagci |
| 2007/0129087 A1 | 6/2007 | Bell |
| 2007/0286089 A1 | 12/2007 | Nasle et al. |
| 2007/0290845 A1 | 12/2007 | Benjelloun et al. |
| 2008/0024096 A1 | 1/2008 | Pan |
| 2008/0030317 A1 | 2/2008 | Bryant |
| 2008/0042731 A1 | 2/2008 | Daga et al. |
| 2008/0106425 A1 | 5/2008 | Deaver et al. |
| 2008/0159244 A1 | 7/2008 | Hunziker |
| 2008/0224617 A1 | 9/2008 | Keller et al. |
| 2008/0249723 A1 | 10/2008 | McAllister et al. |
| 2009/0102680 A1 | 4/2009 | Roos |
| 2009/0115426 A1 | 5/2009 | Muench, Jr. et al. |
| 2009/0146839 A1 | 6/2009 | Reddy et al. |
| 2009/0167308 A1 | 7/2009 | Lomes |
| 2009/0167418 A1 | 7/2009 | Raghavan |
| 2009/0296488 A1 | 12/2009 | Nguyen et al. |
| 2010/0074034 A1 | 3/2010 | Cazzaniga |
| 2010/0244935 A1 | 9/2010 | Kim et al. |
| 2012/0029715 A1 * | 2/2012 | Curt et al. .................... 700/291 |

(56) References Cited

U.S. PATENT DOCUMENTS

| | | |
|---|---|---|
| 2012/0139335 A1 | 6/2012 | Holland |
| 2012/0154023 A1 | 6/2012 | Pan et al. |
| 2012/0181095 A1 | 7/2012 | Lopez |

FOREIGN PATENT DOCUMENTS

| | | |
|---|---|---|
| EP | 0382929 | 12/1989 |
| FR | 2797356 | 2/2001 |
| JP | S64-041540 | 2/1989 |
| JP | 2501513 | 5/1990 |
| JP | 2154157 | 6/1990 |
| JP | 6074783 | 3/1994 |
| JP | H07-032000 | 2/1995 |
| JP | 08101246 | 4/1996 |
| JP | 09107318 | 4/1997 |
| JP | 10271651 | 10/1998 |
| JP | 2000171492 | 6/2000 |
| JP | 2002199625 | 7/2002 |
| JP | 20020199625 | 7/2002 |
| JP | 2003069731 | 7/2003 |
| JP | 2004088771 | 3/2004 |
| JP | 2004320228 | 11/2004 |
| JP | 2005190481 | 7/2005 |
| JP | 20050190481 | 7/2005 |
| JP | 2006344144 | 12/2006 |
| JP | 20060344144 | 12/2006 |
| JP | 2007020268 | 1/2007 |
| JP | 2007214784 | 8/2007 |
| WO | WO0106336 | 1/2001 |
| WO | WO2006132757 | 12/2006 |
| WO | WO2007116835 | 10/2007 |

OTHER PUBLICATIONS

Communication Cable Inflator/Gas Pressure Centralized Monitoring and Management System, on pp. 44-46, 49 in No. 2 vol. 18 of Automation Techniques and Application in Hellongjiang—Summary attached to Chinese Office Action for Appl. No. 200780015356.0 dated Jul. 6, 2010 as Reference No. 1—See p. 7 (1 page).
European Examination Report issued on Feb. 5, 2011 for European Patent Appl. No. 07 758 717.8-2006 (4 pages).
Chinese Office Action issued on Sep. 28, 2011 for Chinese Patent Appl. No. 200880005285.0 (16 pages).
Chinese Office Action issued on Nov. 14, 2012 for Chinese Patent Appl. No. 200880005285.0 (8 pages).
International Search Report and Written Opinion issued on Jul. 8, 2008 for International Patent Appl. No. PCT/US08/50583 (11 pages).
International Search Report and Written Opinion issued on Jul. 7, 2008 for International Patent Appl. No. PCT/US04/32880 (9 pages).
International Search Report and Written Opinion issued on Feb. 11, 2008 for International Patent Appl. No. PCT/US07/64196 (9 pages).
International Search Report and Written Opinion issued on Mar. 3, 2008 for International Patent Appl. No. PCT/US07/77418 (9 pages).
International Search Report and Written Opinion issued on Jul. 23, 2008 for International Patent Appl. No. PCT/US08/55613 (7 pages).
International Search Report and Written Opinion issued on Jul. 31, 2008 for International Patent Appl. No. PCT/US08/56008 (10 pages).
International Search Report and Written Opinion issued on Sep. 26, 2008 for International Patent Appl. No. PCT/US08/70879 (8 pages).
International Search Report and Written Opinion issued on Oct. 3, 2008 for International Patent Appl. No. PCT/US08/70881 (8 pages).
International Search Report and Written Opinion issued on May 8, 2009 for International Patent Appl. No. PCT/US09/35693 (5 pages).
Japanese Office Action issued on Sep. 4, 2012 for Japanese Patent Appl. No. P2009-545014 (8 pages).
Japanese Office Action issued on Feb. 14, 2012 for Japanese Patent Appl. No. P2009-500631 (6 pages).
International Search Report and Written Opinion issued on Jun. 3, 2008 for International Patent Appl. No. PCT/US04/26874 (5 pages).
International Search Report and Written Opinion issued on Nov. 2, 2005 for International Patent Appl. No. PCT/US04/32878 (5 pages).

* cited by examiner

SYSTEM, METHOD, AND APPARATUS FOR A SAFE POWERLINE COMMUNICATIONS INSTRUMENTATION FRONT-END

CROSS REFERENCES TO RELATED APPLICATIONS

The present application claims priority to U.S. Provisional Application No. 61/259,855, filed Nov. 10, 2009, the entire contents of which are hereby incorporated by reference.

BACKGROUND

Powerline communication (PLC) technologies have greatly increased in complexity and number over the last decade. The difficulties present in the powerline environment, including noise, severe resonances, complex topologies, large attenuation, and time-varying parameters make success with any PLC scheme extremely difficult Testing and analyzing PLC networks can be done with general purpose communications test equipment. However, because PLC signals are carried over power lines, it may difficult to analyze certain parts of a PLC network due to the high voltages carried by the lines that are also carrying the PLC signals. These high voltages may be hazardous to individuals, and may also be unsafe for use with general purpose communications test equipment. This may result in a reduced ability to safely test and analyze a PLC network, as only certain parts of the network may be safely tested with general purpose communications test equipment.

SUMMARY

In various embodiments, a system, method, and apparatus are provided for adapting general purpose communications test equipment to test PLC signals on power lines.

In one embodiment a safe powerline communications instrumentation front end device includes a voltage input for receiving a line voltage from a powerline, a voltage reducer for reducing the voltage of the line voltage, a filtering system for extracting a Power Line Communications (PLC) signal from the line voltage, and an analog output for outputting the PLC signal as an analog signal for communications test equipment In one embodiment, a method for testing and analyzing PLC systems using a safe powerline communications instrumentation front end device includes receiving a line voltage, reducing the voltage of the line voltage, extracting PLC signals from the line voltage, and outputting the PLC signals as analog signals for communications test equipment.

In one embodiment, a system for testing and analyzing PLC systems using a safe powerline communications instrumentation front end device includes a front end device installed near a powerline, communications test equipment for testing and analyzing a PLC communications system, and a cable configured for connecting the front end device to the communications test equipment.

Additional features and advantages are described herein, and will be apparent from, the following Detailed Description and the figures.

DETAILED DESCRIPTION

In various embodiments as illustrated in FIGS. 1-9, a safe powerline communications instrumentation front end device processes signals from a powerline and communicates with general purpose communications test equipment.

Figure 1:
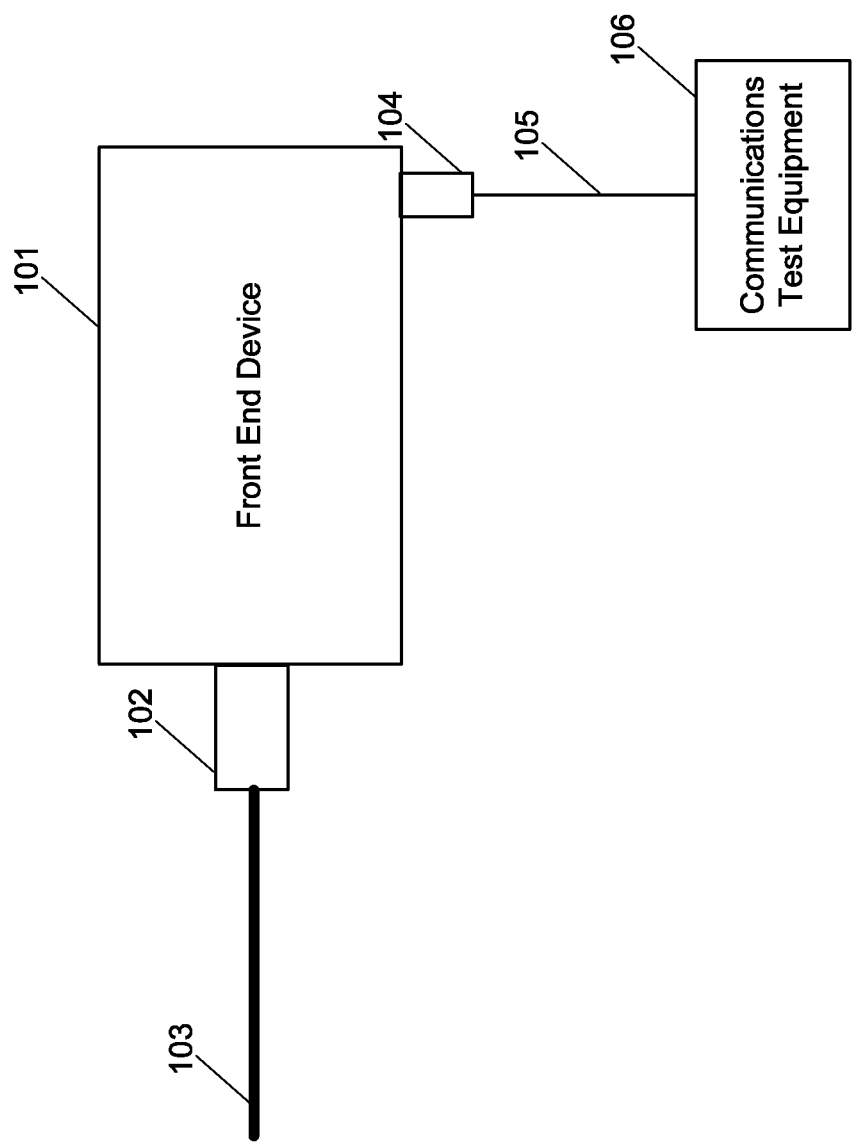
FIG. 1 depicts an exemplary overview diagram of a safe powerline communications instrumentation front end device.

FIG. 1 depicts an exemplary overview diagram of a safe powerline communications instrumentation front end device. The safe powerline communications instrumentation front end device 101 may be a bridging device that enables the safe use of existing general purpose communications test equipment 106 in a PLC system. The front end device 101 may accept the line voltage from the powerline 103 through the voltage input 102, may condition and filter the signal from the powerline 103, and may provide a low-voltage, isolated, filtered signal on the output 104 across the cable 105 to the communications test equipment 106. The function of the front end device 101 may be performed by a single physical device, or by multiple physical devices.

When the front end device 101 is applied to the powerline 103 in a PLC system, a user may be able use the communications test equipment 106 in a line voltage system where it may not be safe to attach the communications test equipment 106 directly to the powerline 103. The front end device 101 may accept input(s) to the voltage input 102 at full line voltage, which may be 600V. The line voltage may contain PLC signals from a transmitter located in the power distribution system, or noise signals of interest in PLC communications. The front end device 101 may use circuitry to reduce the line voltage from the powerline 103 to safe levels, and then may apply various filtering and conditioning techniques to the signals from the powerline 103. The low voltage signals may then be buffered and sent to the output 104, which may be suitable for direct connection to the communications test equipment 106. The communications test equipment 106 may be any general purpose communications test equipment, including, for example, spectrum or network analyzer, oscilloscope, data recorder, and so on. The front end device 101 may also provide optical or magnetic isolation between the voltage input 102 and the output 104, for user safety.

The voltage input 102 of the front end device 101 may be standard 4 mm banana jacks, and suitable CAT IV 600V rated leads. The output signals from the output 104 may terminate into the standard Bayonet Neill-Concelman (BNC) inputs of the communications test equipment 106. It may not be desirable to use BNC jacks on the front end device 101, so the output 104 may use a weatherproof connector which contains all output signals, and a separate cable assembly may be used to convert the outputs to BNC connectors. This may help to maintain the CAT IV 600V rating, and may be more conducive to weatherproof construction.

Various parameters of the filtering and conditioning techniques may be user-configured. Additionally, the front end device 101 may include multiple outputs 104, which may allow the same voltage input to be viewed with different filters simultaneously. Optional markers, reference level bars, and other special signals may be superimposed on the low voltage signal sent through the output 104.

In one embodiment, the front end device 101 may have a single voltage input 102 connected to a single powerline 103. In another embodiment, the front end device 101 may include multiple voltage inputs 102, which may allows for analysis of polyphase systems (e.g. wye, delta circuits). The front end device 101 may be used without the capability to configure the device parameters, or with the ability to configure parameters through a standard port and control device, such as, for example, with a USB port connected to a laptop or PC.

The front end device 101 may be configured in different ways for different classes of PLC signals. PLC systems may be divided into two classes, low frequency and high frequency. Low frequency protocols, such as, for example, X10, INSTEON, KNX, LonWorks, Turtle TS1 and TS2, TWACS, and so on, may be low-bandwidth systems, which may be used for control and low-data rate applications such as automated meter reading (AMR), or other "smart-grid" applications. Low frequency protocols may generally operate in the DC-500 kHz range, and may often be narrowband. High frequency protocols, such as, for example, HomePlug, HD-PLC, and OPERA, may operate in the 1-30 MHz band, and may have very high data rates. These may be the Broadband over Powerline (BPL) systems. The front end device 101 may be suited only for low frequency or high frequency systems, or may have separate hardware to handle both types simultaneously.

The front end device 101 may also perform sophisticated filtering and triggering to allow more efficient use of the communications test equipment 106. Recording and playback features may also be present in the front end device 101, which may allow a user to record a signal in the field, and play it back later in a laboratory for analysis.

The front end device 101 may come in a variety of configurations depending on the type of signals carried on the powerline 103.

Figure 2:
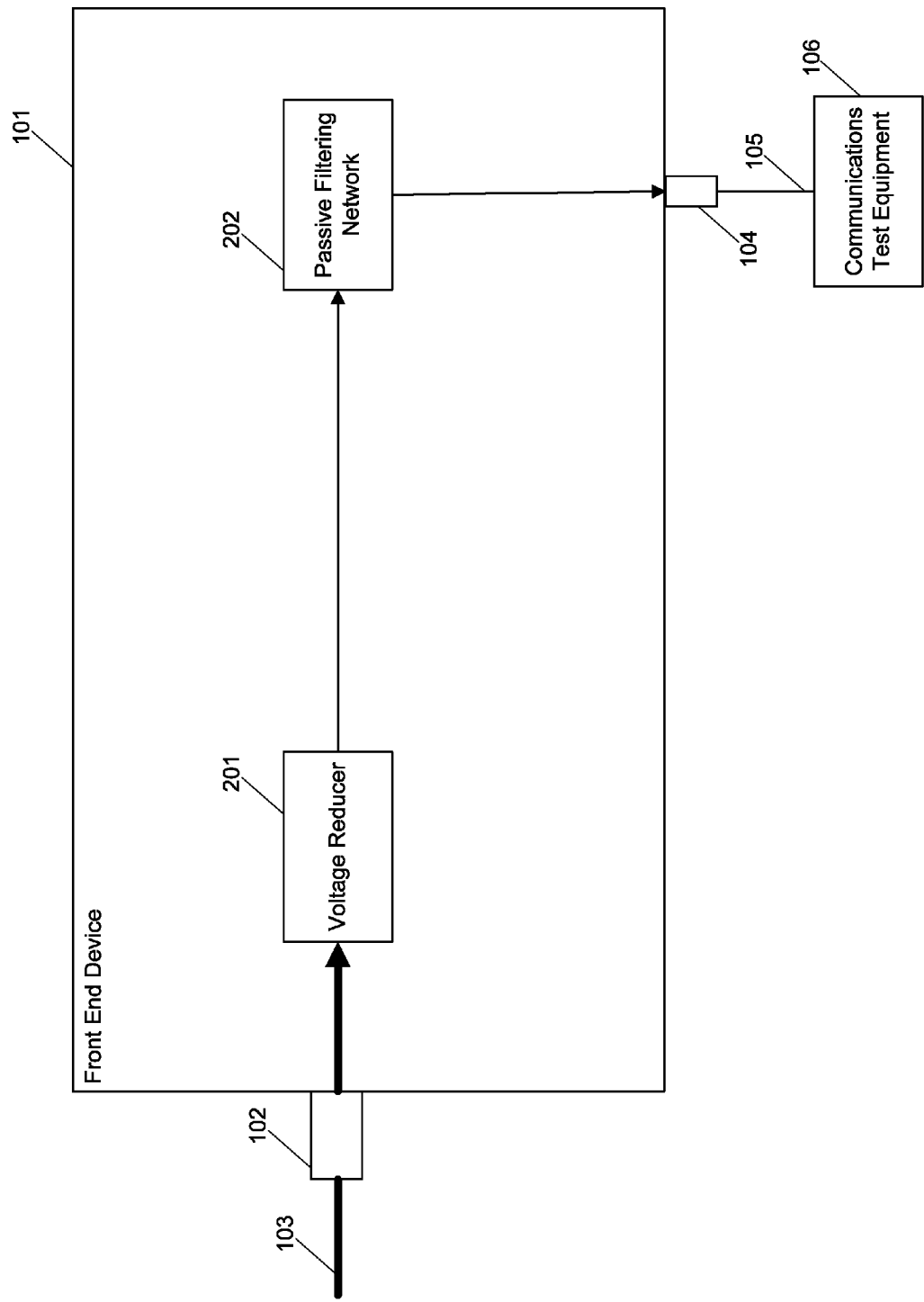
FIG. 2 depicts exemplary diagram of a safe powerline communications instrumentation front end device with passive filtering.

FIG. 2 depicts an exemplary diagram of a safe powerline communications instrumentation front end device with passive filtering. In one embodiment, the front end device 101 may include the voltage input 102, scaling and isolation circuitry, and the voltage output 104. The scaling and isolation circuitry may include passive components, including a voltage reducer 201 and a passive filtering network 202. The voltage reducer 201 may be, for example, any suitable isolation transformer, or any suitable pulse-withstanding divider resistors. No Analog to Digital (A/D) or Digital to Analog (D/A) converters may be necessary with the passive filtering network 202. The passive filtering network 202 may use a combination of passive bandpass or shelf filters, and an optional line-frequency notch filter. A CAT IV 600V rating may be achieved by suitable spacing and transformer design. Various filters may be switched in and out of the passive filtering network 202 with mechanical switches, or by having multiple outputs 104, with different filters in the passive filtering network 202 used for each output 104.

The signal from the powerline 103 may enter the front end device 101 through the voltage input 102. The voltage reducer 201 may reduce the voltage from the signal from powerline 103 down to safer level. The low voltage signal from the voltage reducer 201 may pass through the passive filtering network 202, which may filter out noise and optimize the signal for use by the communications test equipment 106. The optimized signal may be sent out through the output 104, and across the cable 105 to connected communications test equipment 106. The signal may not be digitized at any point, and may be analog across the entire system.

Pulse-withstanding divider resistors may scale the larger voltage input from the powerline 103 down to a reasonable circuit voltage, for example, 1V. A passive RC shelf filter may be used to attenuate the line frequency, reducing the required A/D dynamic range. A typical shelf filter may have a 20 db attenuation at the line frequency. Although the shelf filter may be constructed from passive components, the shelf filter may be adjustable by suitable switching of passive devices via analog switches or relays, or other suitable means. If the front end device 101 is to be used with high-frequency PLC schemes, the front end device 101 may use transformer couplings instead of pulse-withstanding divider resistors as the voltage reducer 201. This may avoid high frequency rolloff with high-value resistors and stray capacitance.

Some signals on the powerline 103 may be better analyzed with active signal processing instead of passive filtering with the passive filtering network 202.

Figure 3:
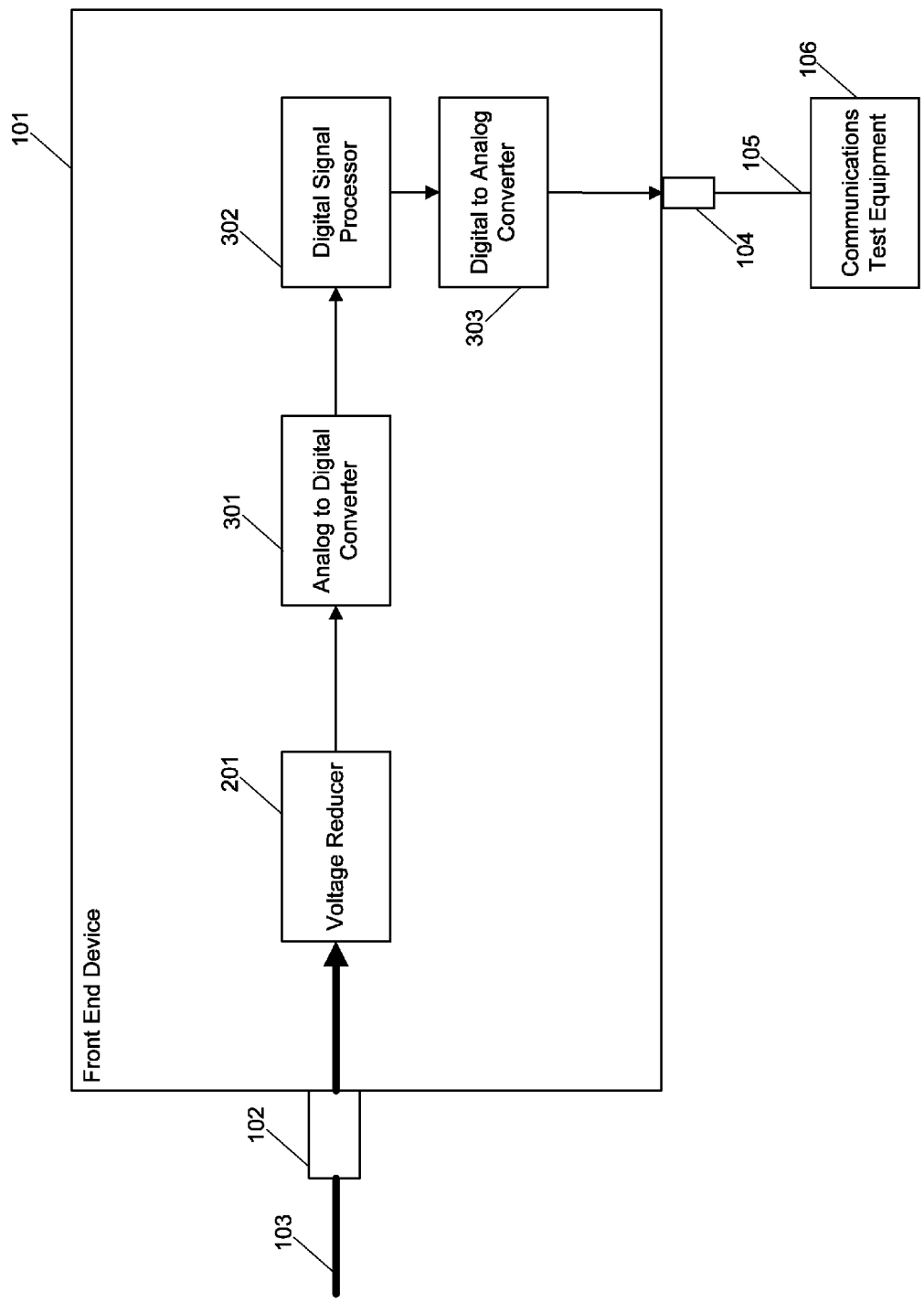
FIG. 3 depicts an exemplary diagram of a safe powerline communications instrumentation front end device with active signal processing.

FIG. 3 depicts an exemplary diagram of a safe powerline communications instrumentation front end device with active signal processing. The front end device 101 may include the voltage reducer 201, an A/D converter 301, a Digital Signal Processor (DSP) 302, and a D/A convertor 303.

The front end device 101 may act as an interface between the raw power line signal on the powerline 103, which may contain both line frequency power and small PLC signals, and the communications test equipment 106. This interface may be needed due to the dangerous voltages, hazardous locations, and special signal processing involved with PLC communications schemes, all of which may prevent direct use of the communications test equipment 106. The front end device 101 may attach directly to line voltage conductors of the powerline 103, reduce the voltage to safe levels, and provides an isolation and safety barrier from high-voltage transients. The input signal from the powerline 103 may be digitized and processed to remove the effects of the large line frequency signal, which may otherwise mask many PLC signals and make it difficult or impossible to use the communications test equipment 106. The processed signal may then be converted to an analog signal, amplified, and brought out to standard BNC or other connectors, ready to be connected to the communications test equipment 106 for PLC signal analysis. The front end device 101 may generally do little or no communications analysis itself, however, the front end device 101 may perform any suitable communication analysis.

The signal from the powerline 103 may enter the front end device 101 through the voltage input 102 and be voltage reduced by the voltage reducer 201, as in the front end device 101 with passive filtering. The output of the shelf filter may optionally be further conditioned with analog filtering or buffering before being passed to the A/D converter 301.

The A/D convertor 301 may be any suitable device for digitizing an analog signal. The A/D converter 301 may sample the signal at a rate suitable for PLC communications analysis, for example, around 1 MHz for low-frequency PLC schemes, and 80 MHz or higher for high-frequency schemes. The sampling rate may be set to optimize the digital filtering to follow. For example, if a comb filter is performed on the digital samples, the A/D convertor 301 sampling rate may be synchronized to the frequency of the powerline 103, and also set so that many line frequency harmonic periods are an integer number of A/D samples in duration. The A/D converter 301 may be of sufficient resolution to detect low-amplitude protocols such as Turtle TS1 and TS2, which may be 16 bits or higher.

The digital output of the A/D converter 301 may be electrically isolated with an isolation barrier, to allow the front end device 101 to achieve a 600V CAT IV rating. This may be done with optical or magnetically coupled digital isolation circuits between the serial A/D converter 301 output and the rest of the digital circuitry.

After the isolation barrier, the digital signal output from the A/D convertor 301 may pass through a programmable logic device that may deserialize the A/D stream. This may allow for the digital signal to be input to a parallel interface for the DSP 302. Other suitable interfaces may be used. For example, the DSP 302 may have a high speed direct serial interface, which may obviate the need for the digital output of the A/D convertor 301 to be parallelized.

The front end device 101 may include only a single input chain, or may include two or more, for polyphase systems. Each input may be identical, and may be isolated from the DSP 302 circuitry for safety.

The DSP 302 may compute output signals from the digital signal, and feed these output signals to one or more D/A converters 303. The D/A convertor 303 may be any suitable device for converting a digital signal to analog. The D/A convertor 303 may be clocked synchronously to the A/D converter 301, or independently, as required. A programmable logic device may be used to serialize the output signals of the DSP 302 in the case of high-speed serial D/A convertors 303. The D/A convertor 303 outputs may be filtered by suitable analog reconstruction filters, and then buffered. The signal outputs may be designed for standard 1 Mohm or 50 ohm test equipment inputs. In the case of 50 ohm output impedance, suitable driver circuitry may maintain the required impedance over the entire frequency band. The analog signals output from the D/A convertor 303 may be sent to the output 104, then to the communications test equipment 106 across the cable 105. The communications test equipment 106 may then test and analyze the PLC signals.

The DSP 302 may be able to correct for hardware inaccuracies such as gain and offset errors, input and output filter frequency response, such as, for example, magnitude and phase, and so on. as necessary. The DSP 302 may use nonvolatile correction factors, programmed at the factory, which may be applied by the DSP 302 as appropriate in the signal chain. These nonvolatile correction factors may include corrections at various temperatures, in addition to room temperature data. Where temperature compensation is needed, the front end device 101 may include one or more internal temperature sensors. The front end device 101 may also include reference broadband noise, DC, or D/A generated signal sources which may be fed into the A/D input chain, and may be used for autocalibration in the field. D/A outputs may be read with an auxiliary A/D to aid in autocalibration of the output signal path.

A main power supply may be included in the front end device 101 to power the DSP 302 and D/A convertor 303, and an isolated power supply may be included to power the A/D convertor 301. In the case of multiple voltage inputs 102, the isolated power supply may have multiple outputs, each isolated from the others. The front end device 101 may use power from an internal battery, USB input, or line voltage input from the powerline 103. If line voltage input power is used, any suitable means of filtering power supply noise from the voltage input 102 may be used.

If the front end device 101 is to be used with high-frequency PLC schemes, the front end device 101 may use transformer couplings as the voltage reducer 201. These transformers may provide the CAT IV 600V isolation, and present a good impedance match to the broadband amplifiers that may drive the A/D converter 301. Since it may not be practical to create a transformer with a bandwidth from 60 Hz to 30 MHz or more, the transformer may act as a high-pass filter, removing the line frequency and most harmonics. In this case, a separate isolated means of feeding the line frequency signal to the DSP 302 may be needed, for example, an optical isolator or separate A/D system. This may be included so that the DSP 302 may perform triggering in a synchronous fashion, which may be desired even for high-speed PLC signals. The front end device 101 may also include both transformer couplings and pulse-withstanding divider resistors, to allow simultaneous low- and high-frequency analyses.

The front end device 101 may also include auxiliary analog inputs, which may allow the powerline 103 currents to be measured. The auxiliary analog inputs may be sampled by a different A/D subsystem, and input into the DSP 302. The signals from the auxiliary analog inputs may be used for triggering various filters or markers on the analog outputs. External off-the-shelf current transducers such as, for example, Rogowksi coils or iron-core clamp-on transformers may be used to convert the line current into a low voltage suitable for digitizing. The sampling rate and filtering for these auxiliary analog inputs may be different than for the voltage inputs 102, since the PLC signals themselves may not be present on them.

High-frequency PLC analysis, involving sampling rates of 80 MHz or more, may require more processing power than the DSP 302 can achieve.

Figure 4:
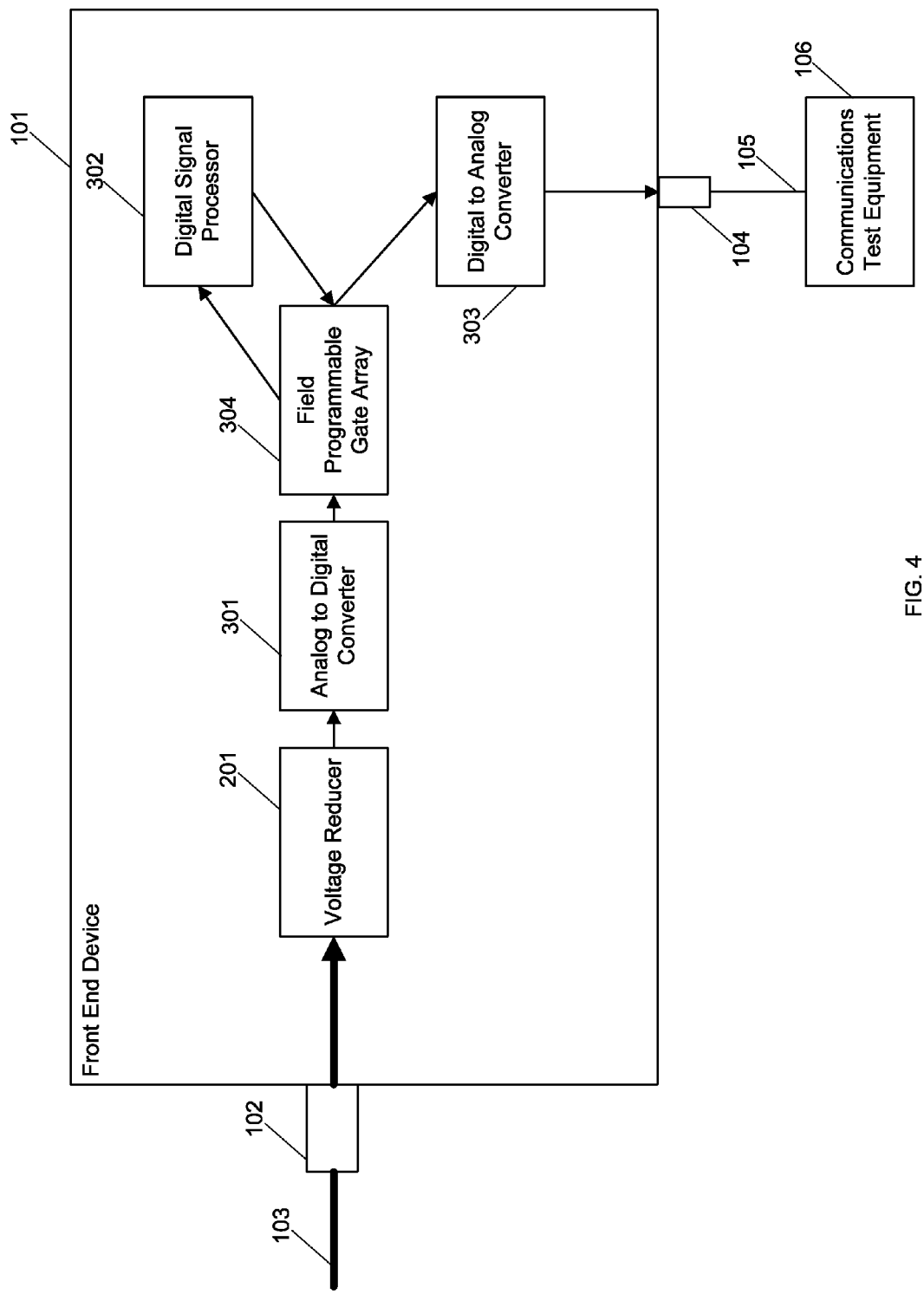
FIG. 4 depicts an exemplary diagram of a safe powerline communications instrumentation front end device with a field programmable gate array.

FIG. 4 depicts an exemplary diagram of a safe powerline communications instrumentation front end device with a field programmable gate array (FPGA). The front end device 101 may include an FPGA 304 or other high-speed programmable logic device, which may allow for the processing of high frequency PLC systems at high sample rates. Various input and output filters may be applied using the FPGA 304, including sample rate conversion/decimation, and FFT computations. The FPGA 304 may receive the raw A/D samples, which may be the digital output of the A/D convertor 301, pre-process them, and then send them to the DSP 302. The DSP 302 may output D/A values to the FPGA 304 for post-processing. The FPGA 304 may send the post-processed D/A values to the D/A convertor 303, for conversion to an analog output signal. In filtering schemes, the DSP 302 may not perform any direct data processing, but may instead perform configuration of the FPGA 304, such as, for example, calculating and loading filter coefficients, and so on, or secondary processing in parallel with the FPGA 304.

The front end device 101 may include the DSP 302 to apply filtering and processing to the input signals, and compute the output signals. Functions such as time keeping, data storage, battery charging, communications, and so on, may be handled by a separate microprocessor, or they may be performed by the DSP 302 in addition to the signal processing tasks. The DSP 302 may include such auxiliary processors, and may also include the entire processing system, including external SRAM/SDRAM memory, Flash memory, and communications modules, such as, for example, Bluetooth, Ethernet PHY, and so on.

The front end device 101 may be separated into two physical devices. One device may connect directly to the powerline 103, and draw power from the connected voltage. This device may digitize the AC signals, and use WiFi or other wireless means to transmit the raw samples to the second device in real-time. The second device may not be physically connected to the powerline 103, and thus may not have any extra safety or isolation requirements. The second device may include the main signal processing section, and signal output lines.

Figure 5:
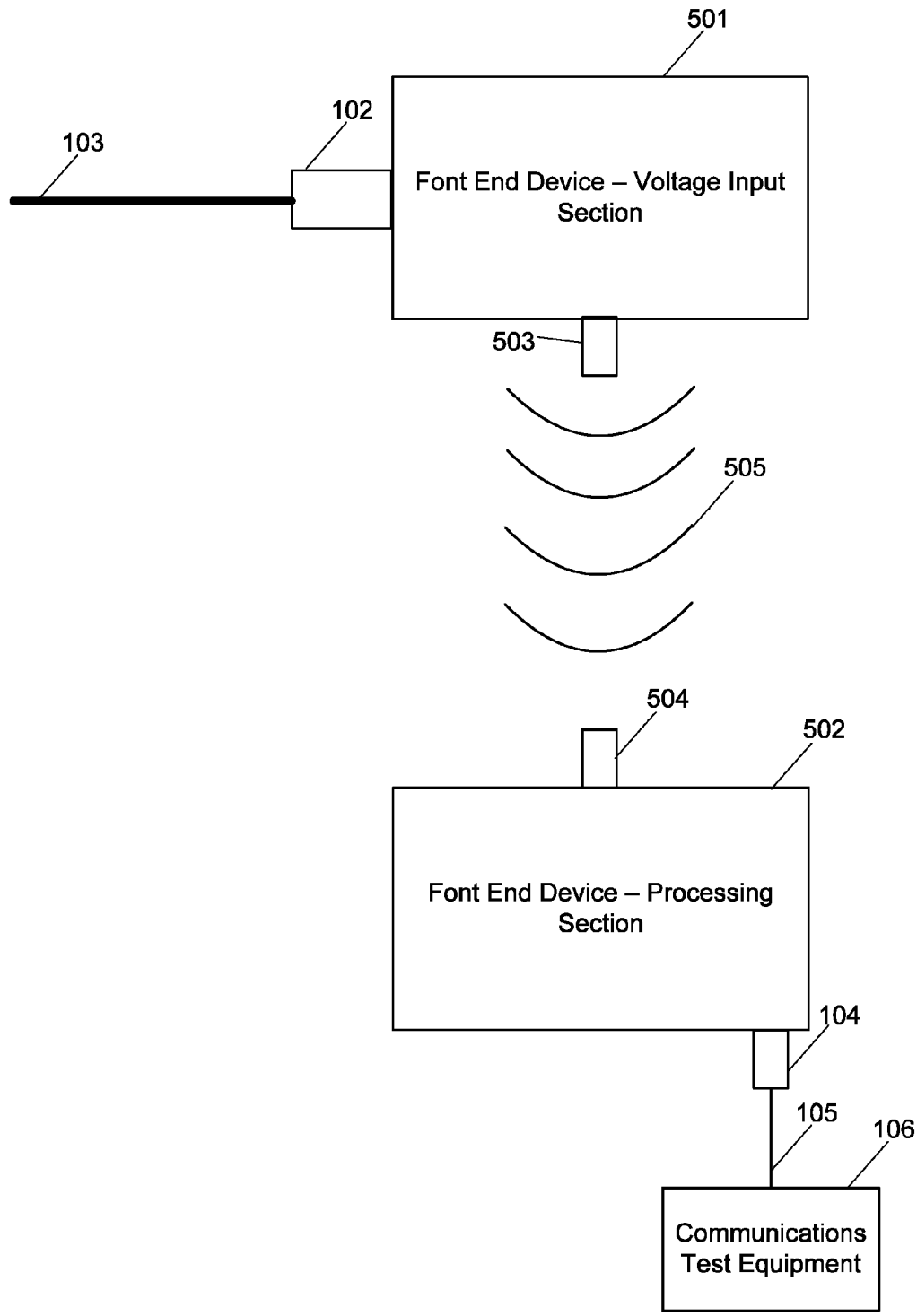
FIG. 5 depicts an exemplary overview diagram of a safe powerline communications instrumentation front end device with wireless communication between physically separate voltage input and processing sections.
Figure 6:
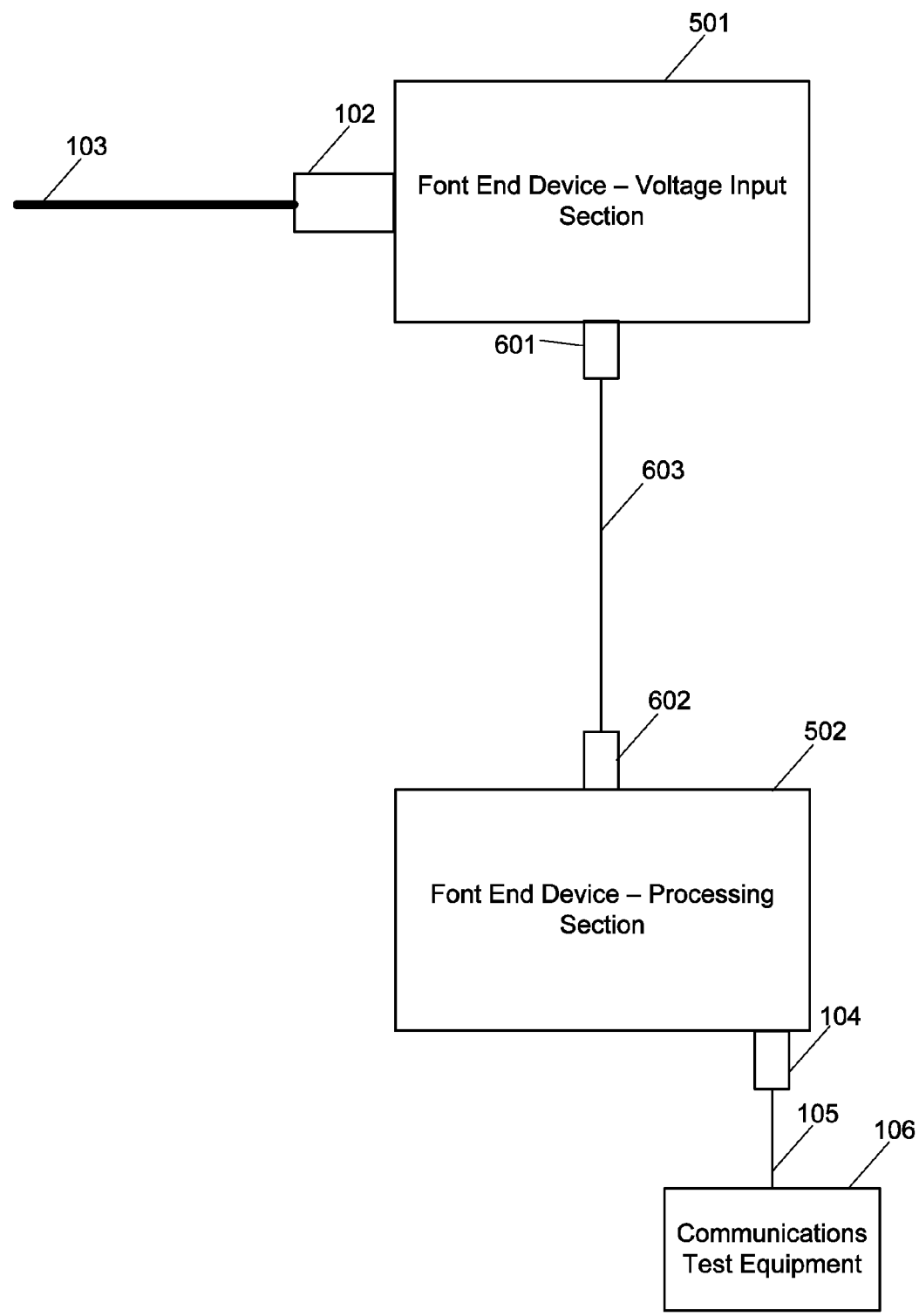
FIG. 6 depicts an exemplary overview diagram of a safe powerline communications instrumentation front end device with wired communication between physically separate voltage input and processing sections.

FIG. 5 depicts an exemplary overview diagram of a safe powerline communications instrumentation front end device with wireless communication between physically separate voltage input and processing sections, and FIG. 6 depicts an exemplary overview diagram of a safe powerline communications instrumentation front end device with wired communication between physically separate voltage input and processing sections.

The front end device 101 may be implemented using two separate physical devices. The first device may be a voltage input section 501, and the second device may a processing section 502.

The voltage input section 501 may include the parts of the front end device 101 up through the isolation barrier for the A/D convertor 301 in one enclosure. The processing section 502 may include the parts of the front end device 101 after the isolation barrier in a separate enclosure. For a wireless connection, a wireless output 503 of the voltage input section 501 may be any suitable wireless communications device, such as, for example, a Wi-Fi or Bluetooth device, and may be used to send the A/D signals from the voltage input section 501 to a wireless input 504 on the processing section 502 using wireless connection 505. The wireless input 504 may also be any suitable wireless communications device. Both the wireless output 503 and the wireless input 504 may be capable of two-way communication. For a wired connection, a wired output 601 of the voltage input section 501 may send the A/D signals to a wired input 602 of the processing section across a cable 603, which may be, for example, a fiber optic cable. Both the wired output 601 and the wired input 603 may be capable of two-way communication.

Physically separate devices for the voltage input section 501 and processing section 502 may be used when the voltage connections are in a hazardous location, for example, on top of a power pole, in an underground vault, and so on. The communications link itself may be the isolation barrier in this case, if the link is wireless or non-electrical. The same effect may also be accomplished by keeping the voltage reducer 201 and the DSP 302 in one enclosure, and putting the D/A convertor 303 in the separate enclosure. This may be desired if the DSP 302 is performing any triggering or recoding functions, and the front end device 101 is to be left in place for a period of time.

Figure 7:
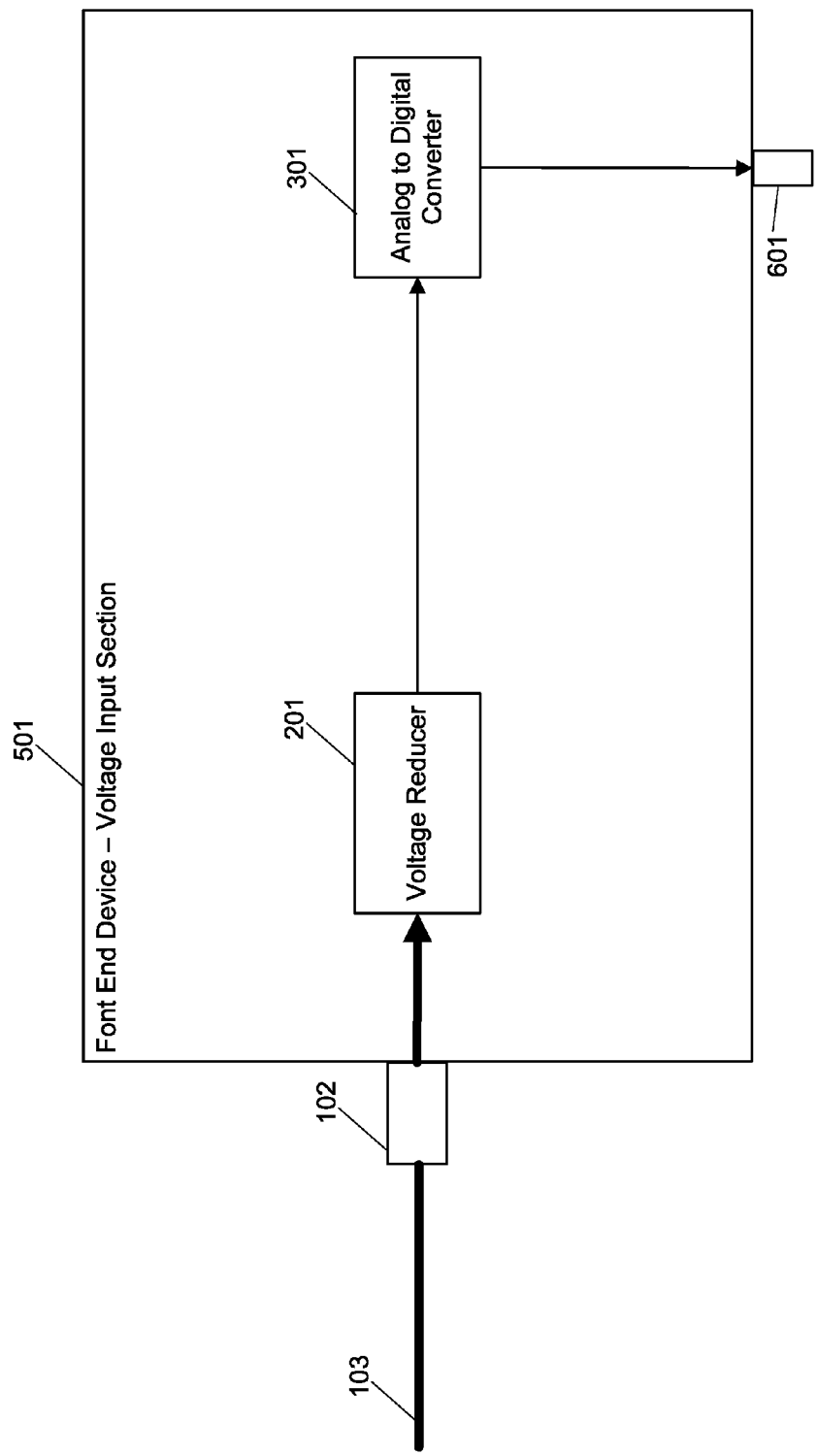
FIG. 7 depicts an exemplary diagram of a voltage input section for a safe powerline communications instrumentation front end device with physically separate voltage input and processing sections.

FIG. 7 depicts an exemplary diagram of a voltage input section for a safe powerline communications instrumentation front end device with physically separate voltage input and processing sections.

The voltage input section 501 may include the voltage input 102 for the powerline 103, the voltage reducer 201, the A/D convertor 301, and the wired output 601 or the wireless output 503. The voltage input section 501 may be connected directly to the AC power conductors in the powerline 103, and may meet the full CAT IV 600V safety requirements. The signals from the powerline 103 may be reduced in voltage by the voltage reducer 201, shelf-filtered or have other analog filtering applied, and digitized with the A/D converter 301. The digital signals from the A/D converter 301 may then be read by a microprocessor or a DSP, and buffered in memory. The digital signals may then be transmitted to the processing section 502 using the wired output 601 or the wireless output 503, or other suitable communications means. The voltage input section 501 may be small enough to fit inside an electrical panel or transformer enclosure, so the panel door can be completely closed, with voltage input section 501 inside.

Figure 8:
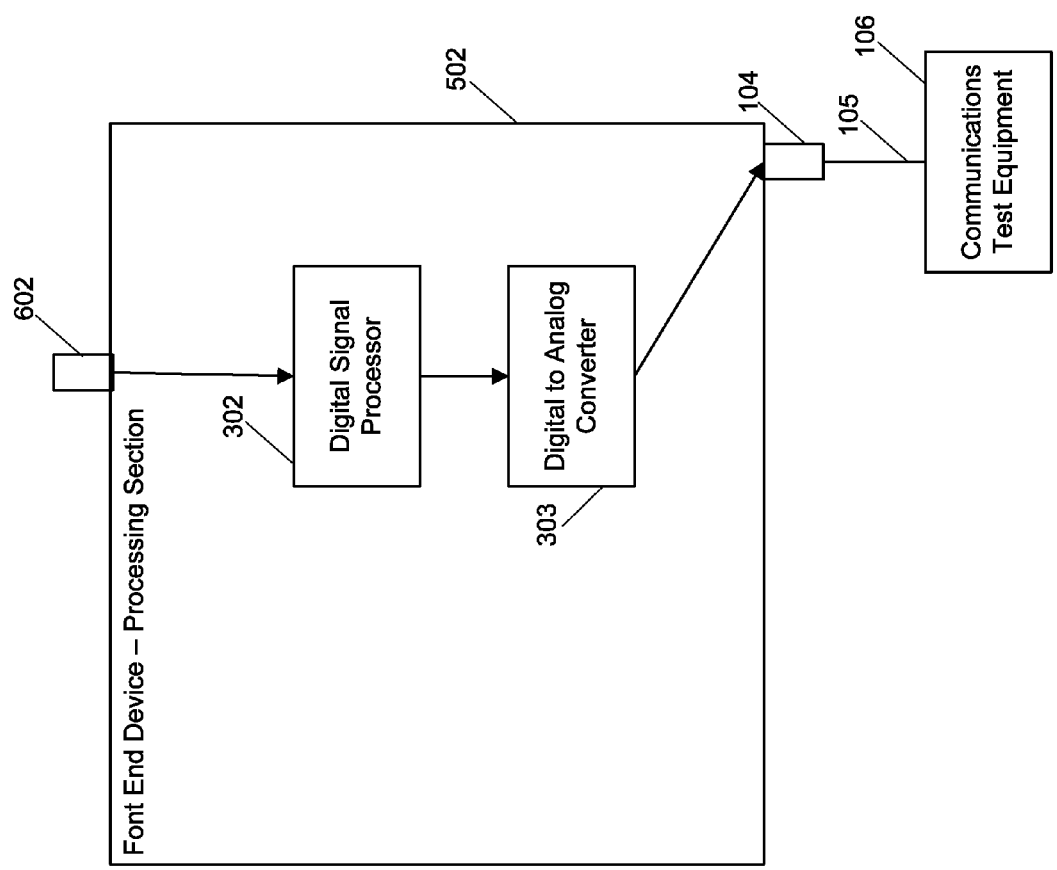
FIG. 8 depicts an exemplary diagram of a processing section for a safe powerline communications instrumentation front end device with physically separate voltage input and processing sections.

FIG. 8 depicts an exemplary diagram of a processing section for a safe powerline communications instrumentation front end device with physically separate voltage input and processing sections.

The processing section 502 may include the main DSP 302, where all digital filtering and other operations may be performed, and the D/A converter 303. This may provide complete isolation from arc-flash and other hazards associated with high voltage electrical environments, since the user only has to work directly with the processing section 502. The processing section 502 may receive the A/D signals from the voltage input section 501 with the wired input 602 or the wireless input 504. The processing section 502 may be connected directly to the communications test equipment 106, and may output the analog signals from the D/A convertor 303 to the communications test equipment 106 through the output 104 over cable 105.

Instead of being in a separate enclosure, the processing section 502 may be software residing on a PC or laptop. The voltage input section 501 may stream the A/D samples directly to the PC, which may then perform the signal conditioning and filtering functions, and display the data directly on the screen, instead of sending the results to the D/A converter 303 and the communications test equipment 106 for further analysis. The data from the voltage input section 501 may also be simultaneously broadcast to both a PC and a processing section 502 in a separate enclosure.

The voltage input section 501 may also be constructed for use in a standard wall outlet, such as, for example, a US 120V receptacle. For a voltage input section 501 for use in a wall outlet, a lower voltage and safety rating, for example, 150V CAT II, may be acceptable.

The system may allow simultaneous input from multiple voltage input sections 501, for example from one or more 120V receptacle devices, and one or more polyphase 600V devices. The A/D streams may be filtered independently, or combined as needed, just as if they had originated from the same voltage input section 501. Suitable A/D synchronization may be sent from the processing section 502.

The A/D sampling rates may be adjusted as necessary where the communications link limits the data rate. For example, if WiFi is used to connect the voltage input section 501 to the processing section 502, and the WiFi link cannot support the highest A/D data rate, the sampling rate may be reduced by the voltage input section 501. Alternatively, one or more channels may be eliminated from the data stream, as needed. The voltage input section 501 may provide bandpass filtering to allow for data reduction or compression techniques, to maximize the effective sample rate through the wireless link. This management process may be performed automatically, or at the direction of the user. One method for automatic selection of A/D inputs to eliminate may be for the voltage input section 501 to automatically detect PLC signals on each phase input, and select the phase containing the signal of interest.

The voltage inputs 102 of the front end device 101 may be electrically balanced, and passed through a differential signal chain, to avoid common-mode noise, for example, when the signal outputs are connected to grounded communications test equipment 106. Even though the voltage inputs 102 are electrically isolated, stray capacitance across the barrier can cause noise across the barrier. This may be minimized by using balanced voltage inputs 102. Two wires would be used for each voltage input 102. To reduce the number of connection points, and size of the front end device 101, the front end device 101 may use differential amplifiers internally, and balanced resistive dividers, but tie one of the two input lines from each voltage input 102 to a common connection. In this configuration, the voltage inputs 102 may all be true balanced, differential inputs, but have one leg of each input connected together. This may result in the voltage inputs not only being isolated from the DSP 302 and the output 104, but also from each other. In a low-cost front end device 101, it may be possible to not isolate each of the voltage inputs 102 from the others, if other noise-reducing means are taken, such as, for example, DSP filtering to remove line frequency noise.

The front end device 101 may include a USB port for communications with a device such as a PC or laptop. PC software may be used to configure the front end device 101 through the USB port. The USB port may also be used to power the front end device 101. The USB port may be an On-The-Go port which may allow the front end device 101 to be a USB peripheral when connected to a PC, but a USB host when connected a USB Flash drive. When a Flash drive is connected, the front end device 101 may stream the input and output signals to the connected drive in real-time, for analysis later. Configuration data from a PC to the front end device 101 could also be transferred via USB Flash card. The front end device 101 may also include other wired or wireless communications devices, such as, for example, Bluetooth, WiFi, Ethernet, or a cell modem, in addition to, or in place of, the USB port. In some embodiments, multiple front end devices 101 may be linked together through their communications port, allowing for cross triggering.

Since powerline conductors such as the powerline 103 are often outdoors, the front end device 101 may be rugged and weatherproof. A NEMA-4X or IP-65 rating may be required, and may be achieved through suitable enclosure design, connectors, and internal sealing and potting as needed.

The front end device 101 may include an audio output, such as a headphone or speaker output. The signal for the audio output may be generated by the DSP 302, and may be suitably processed so the entire band or signal of interest is in the audio band. The audio output may be a standard ⅛" or ¼" stereo jack on the front end device 101, or the signal may be brought out through the same cable harness as the BNC outputs through the output 104. An onboard speaker may be used to play the output directly inside the front end device 101. Alternatively, the front end device 101 may include an integral Bluetooth module, programmed to support the Bluetooth headset or wireless speaker profile. In that case, audio information may be sent via Bluetooth, and no speaker or headphone jack may be required.

The audio output may allow a user with headphones or a speaker to listen to PLC signals and noise. The DSP 302 may route applicable signals to special audio D/A outputs. For low-frequency PLC schemes, the entire band may already be inside the audio band, and no further processing may be necessary, except for scaling, bandpass filtering, possible time-domain blanking, and so on. Some PLC schemes are narrowband, but the band may be above the human audio range. In this case, the DSP 302 may shift the frequency band to the audio band with standard signal processing techniques, such as, for example, mixing with an internal oscillator and filter. If the signal bandwidth exceeds the audio band, sample rate conversion or other DSP 302 techniques may be applied to compress the bandwidth so that the entire band is audible.

PLC signals may be brought in to the front end device 101 through auxiliary inputs instead of through the voltage input 102. In this case, the signals may have already been lowered to small voltage levels. The front end device 101 may use an external electric or magnetic field transducer to acquire the raw signal, which may be fed into the system. For example, a magnetic field transducer may be used to examine radiated PLC signals from a nearby powerline 103. The transducer output may be fed into the same signal chain as the voltage inputs 102 of the front end device 101, except for the resistive divider network.

The output 104 may be a high-voltage output, for example 120 or 240V nominal. The output 104 may be used to feed a filtered or conditioned signal into a PLC device for further testing. For example, the front end device 101 may be connected to the powerline 103, set to filter out noise, and output the resulting conditioned signal at a 240V level. A PLC revenue meter may be attached to the signal for testing while various filters were tried in the front end device 101 to see the effects. Alternatively, an external amplifier may be used to boost the low-voltage output of the front end device 101 to line voltage levels.

Although configuration and control of the system has been described as occurring through a communications link to an external PC, PDA, or cell phone, other suitable control mechanisms may be used with the front end device 101. For example, physical switches may be used to enable or disable preset filters and triggers, allowing changes in configuration in the field without another device. In a hybrid front end device 101, the actions of the physical switches could be configured by a communications link to a PC beforehand.

The front end device 101 may include a GPS time-sync input, or a GPS or WWVB receiver to generate accurate timing information, or the front end device 101 may use the Network Time Protocol (RFC 1305), or IEEE 1588 to generate accurate time information or clock synchronization. This time information may be used for accurate sample rate measurement, and also for synchronization with external devices. For example, if a PLC transmission is known to occur at certain precise times, the front end device 101 may use the accurate time signal to perform special processing, or generate output markers at those times, as programmed by the user. Once time synchronization has been achieved, it may be possible to maintain synchronization by counting line frequency cycles, instead of continued use of a GPS or other time source.

The front end device 101 may be designed such that, with no power applied, a passive voltage reducer 201 and passive shelf filter are still operational, and an isolated signal is still present on one or more of the outputs 104. Isolation in this case may be provided with a passive transformer.

The front end device 101 may perform one or more digital signal conditioning and filtering operations, to help adapt the communications test equipment 106 to the unique PLC signal and noise characteristics. Although these functions will be described as being performed by the DSP 302 with digital samples, the functions may also be implemented with special-purpose devices such as the FPGA 304, or with analog hardware.

Each of the filtering operations may be configurable by the user, and have the ability to be enabled or disabled. Many of the filtering operations may be linear, so that the order of application is immaterial. Where this is not the case, the operation order may also be set by the user. In the case of multiple outputs 104, different filter combinations may be performed on the same input signal, and presented on separate outputs 104 simultaneously. The following are operations that the front end device 101 may perform.

Adjustable bandpass filters may allow a user to narrow in on the band of interest. Many PLC schemes are narrow band, and isolating that band may be very helpful. Although spectrum analyzers may isolate signals and bands in the frequency domain, the extreme dynamic range presented by the presence of line frequency voltage may make this difficult without prefiltering in the DSP 302. Additionally, preset bandpass filters designed especially for each PLC scheme may facilitate rapid analysis. In some cases, a custom filter may be desirable, especially one designed to match the input filtering of a targeted PLC receiver, including in imperfections in that filter. User software may allow arbitrary filter shapes, and also allow user-specified filter coefficients. In some cases, the user may specify an all-pass filter, or time-delay filter, for specialized applications. The user may also use the arbitrary filter feature to download custom filters into the front end device 101 for noise whitening or channel equalization.

A comb filter may remove the line frequency component, and all of its harmonics. This may be important for low-frequency protocols, which may coexist in the same band as the harmonics. Filter options include using the line frequency as the fundamental, or submultiples. For example, in a 60 Hz system, a 60 Hz comb filter will remove 60 Hz and all 60 Hz harmonics (e.g. 120 Hz, 180 Hz, etc.). Using the submultiple of 30 Hz also removes 90 Hz, 150 Hz, etc. The front end device 101 may use a phase-lock loop (PLL) or other scheme to adjust either the A/D sampling rate, or the precise filter coefficients so that the fundamental and most harmonics are optimally canceled. This may require that as many large harmonics as possible have periods that are an integer number of A/D samples.

A Shift/Subtract filter may also be implemented to remove synchronous noise. In a Shift/Subtract filter, a representative period of the powerline 103 waveform is used as a reference, and this waveform is subtracted from subsequent periods of data. To the extent that the synchronous noise is constant from one period to the next, it may be removed exactly. This may result in no zeros or other distortions being introduced to the PLC signals themselves. Since the synchronous noise is only relatively constant over a short time, typically 5 to 10 line frequency periods, a new reference waveform may need to be acquired often. This may be done with every period, unless a trigger condition is met which extends this time. The algorithm parameters to control the acquisition of new reference waveforms may be user-adjustable. As with the comb filter, the reference waveform length may be adjusted to a multiple of the line frequency period, for better cancellation.

The voltage reducer 201 may include a shelf-filter, to reduce the power line signal amplitude. This may reduce the required A/D dynamic range to practical values. Once the signal has been digitized, the dynamic range issue may be removed. In some cases, it may be desirable to restore the powerline 103 signal by reversing the analog shelf-filter. The DSP 302 may perform the inverse of this filter digitally. In other cases, it may be desired to perform a further shelf filter operation, and the DSP 302 may apply a standard shelf filter to further reduce the line frequency signal. In the case of multiple outputs 104, the shelf-filtered signal may be applied to one output 104, while the restored signal is applied to another output 104 for comparison.

The front end device 101 may optionally employ notch filters to remove narrowband interference. These may be fixed in frequency and bandwidth, adjustable by the user, or dynamically adjusted by the DSP 302 to automatically detect and track narrowband noise sources. The comb and shift/subtract filtering may remove most line frequency and harmonic components, but other non-synchronous narrowband interferes may still be present, which may require the use of notch filtering.

The DSP 302 may introduce pure time delays in the signal chain. This may be useful when using multiple outputs 104, each with different filtering applied. If the filters introduce different amounts of time delay, the outputs 104 may be adjusted with explicit delays, designed to equalize the delay across all the outputs 104. This may optionally be performed automatically. Manual delays may be desired when the signals are being examined in conjunction with other external signals or events, for example, when feeding the signals into an oscilloscope which is also connected to a PLC transmitter.

In front end devices 101 that perform single phase processing, the voltage inputs 102 for both 120V legs and the neutral may be provided. The two 120V signals may be combined by the DSP 302 to compute the 240V waveform, which may then be filtered and sent to the output 104 as if it had been measured directly. Other processing, specific to single-phase systems, may be performed on the signals before being sent to the output 104. For example, in 120V PLC systems, a signal may be transmitted on one 120V leg, and it may be necessary to measure the coupling into the other 120V leg, by normalizing the output as compared to the first 120V input.

In front end devices 101 that perform polyphase processing for polyphase systems, e.g. 3-phase wye or delta systems, further processing may be present. A transformation matrix may be computed by the DSP 302, which may maximize the noise independence among the phases, and minimize PLC signal leakage from one phase to the others. The transformation matrices may be user-configured, or automatically generated by the DSP 302 based on standard minimization or training techniques. Delta-wye and wye-delta conversion may also be performed in the DSP 302, and the resultant internal signals made available for further processing, and sent as output signals.

Some PLC systems, especially low-bandwidth systems, may only use certain parts of the line frequency waveform. For example, the INSTEON system may transmit on 60 Hz, 120V lines, in bursts lasting 1.823 milliseconds. Each burst may only occur in a 1.823 ms window starting 800 microseconds before a 60 Hz zero-crossing. Thus, only this 1.823 ms time period may be of interest, out of an 8.333 ms 60 Hz half-cycle. The remainder of the 60 Hz waveform may be much larger in amplitude, and may obscure the window of interest if viewed on an oscilloscope, making it impossible to trigger on a transmitted signal. The front end device 101 could optionally zero out all samples outside of this time window, performing time domain masking. Since this is a nonlinear operation, it may be desirable to control when in the signal chain this occurs. The signal may be separated into to two streams, one with the signal window present and the remainder blanked out, and the opposite, for comparison. In polyphase systems, it may be desirable to mask all phases when any phase is outside the signal window, or unmask all phases when any phase is inside the signal window. Instead of zeroing samples outside the signal window, the front end device 101 may optionally just reduce the amplitude of the samples such that the waveform is still visible, but lower in amplitude than the signal window. This may allows the user to view the waveform data, but without obscuring the signal of interest.

In cases where time-domain masking (as described above) is enabled, the samples outside the signal window may normally be zeroed. Instead, the DSP 302 may apply time warping techniques to create a continuous time series out of just the signal window samples. For example, in the INSTEON case, 1.823 ms of data may be kept for every 8.333 ms of samples. The 1.823 ms of data may be stretched to cover the entire 8.333 ms of time, and inserted into the DSP 302 signal chain for further processing. This may be accomplished either by suitable interpolation and decimation techniques to internally resample the data at a new data rate, or by actually changing the D/A sample rate appropriately. For example, if the data were originally sampled at a 1 MHz rate, the signal window may be 1823 samples long, and may need to cover the time taken by 8333 samples. The 1823 samples may be upsampled and downsampled internally to create an 8333 sample equivalent series, suitable for sending to the D/A at a 1 MHz rate. Alternatively, the D/A sampling rate may be changed from 1 MHz to 218.769 kHz, and the original 1823 samples used. In either case, the zero samples that would be present with just time-domain masking may be removed, facilitating analysis with a standard spectrum analyzer. The time warping timing algorithm may track the line frequency to insure correct sample rate conversion.

To aid in detecting PLC signal transmission, the expected time-domain signal of a received transmission may be loaded into the DSP 302. This reference waveform may used to continuously compute the cross-correlation with a voltage input. The cross-correlation signal may then be inserted into the DSP 302 signal chain for optional further filtering, and sent to a D/A output for examination with an oscilloscope or spectrum analyzer. This signal may also be used as a trigger for the communications test equipment 106, indicating that a transmission was sent. Since the cross-correlation peak may occur in the center of the received waveform, time delays maybe used to move this peak to the beginning of the transmission, relative to the other outputs. This cross-correlation could be performed on any signal in the DSP 302, including time-masked signals, and could also have any DSP 302 operation performed on it, as if it had been measured on the voltage input 102.

Arbitrary math functions, such as invert, add, multiple, square, absolute value, integrate, etc. may be performed on any signal in the DSP 302 at any stage in the signal chain. For example, if signals of interest may occur in any half-cycle of the line frequency, it may be desirable to take the absolute value of the signal so that every half-cycle has the same polarity. If signal energy rather than magnitude is of interest, the signal may be squared, etc. Many modern oscilloscopes can also perform these functions, but since some of these may be nonlinear, it may be necessary to perform them before other filtering operations in the DSP 302, which may require the DSP 302 to have this functionality. Sample rate conversion and decimation/interpolation could also be performed.

The DSP 302 may optionally compute the spectrum of a signal, via Fast Fourier Transform (FFT). The resulting magnitude or phase information may be sent as a time-domain output, repeating at the FFT update rate. This may allow viewing the spectrum of a signal with a standard oscilloscope, instead of requiring a spectrum analyzer.

Various useful markers and reference levels may be sent on D/A channels as separate signals, or superimposed on any output signals. For example, line frequency period or signal window markers may be created by replacing samples at the applicable spots with large values, designed to stand out from the data, appearing as vertical lines in the signal trace. These may be used to trigger an oscilloscope or spectrum analyzer, or just used for visual reference. Additionally, markers may be inserted to represent noise or other events in the masked portion when using time-domain masking. DC markers could be used to indicate reference levels for various PLC transmitter levels, signal thresholds, and so on. These DC reference levels may be generated inside the DSP 302, and may include all applicable DC gains that are being applied to the other signals, to facilitate easy calibration with absolute levels after many internal DSP 302 filters have been applied.

If a coordinated time source is available, markers may indicate various programmed times, to mark known transmissions or other external events. For example, if a transmission or test occurs every 15 minutes on exact 15 minute boundaries, the GPS or other accurate time source may be used to generate a marker each time.

The DSP 302 may also synthesize sine waves, reference waveforms or DC levels, or other special signals on auxiliary D/A outputs. For example, a "perfect" received PLC signal could be loaded by PC software into front end device 101, and this waveform sent out a D/A for oscilloscope comparison with the actual received signal. The reference waveform may either be repeated continuously, or only sent based on a trigger condition, such as a cross-correlation or signal level trigger, preprogrammed event time, and so on. Reference waveforms used for correlation computations may also be sent as an auxiliary output. The front end device 101 may include memory to record signals, and these may also be sent to the D/A as an auxiliary output.

The front end device 101 may include a memory buffer which may allow the D/A outputs to be "paused". When paused, the input data may continue to be processed, and D/A output values streamed to memory instead of to the D/A converters. When "unpaused," the outputs may resume, with their values read from memory, reading the earliest data first. From this point forward, D/A values may be read from memory, and new D/A values computed from incoming data streamed to the memory buffer in a First In First Out manner, with the outputs continuing to be delayed from the inputs by the pause time. The D/A data may be continuously buffered for a period of time, for example, 30 minutes, allowing a user to pause, "rewind", and replay signals. PC control may allow the user to repeatedly play D/A values in an endless loop, to facilitate repeated analysis of the same signals with the communications test equipment 106. The front end device 101 may include nonvolatile memory, which may allow users to replay the D/A values in a laboratory, after recording them in the field.

The front end device 101 may also allow time shifting of the A/D inputs instead of the D/A outputs. This may allow the user to adjust filter settings and signal chain parameters repeatedly on the same input data. In this case, all filter state information may be buffered, in addition to the A/D readings, to allow proper "rewinding" of the internal state of the front end device 101. Time shifting of both A/D inputs and D/A outputs may be provided for in the same front end device 101.

As stated, the front end device 101 may include nonvolatile memory, such as battery-backed SRAM or Flash memory. If the front end device 101 has a USB On-The-Go port, a Flash USB memory device may be used. Regardless of the nonvolatile memory source, the front end device 101 may allow streaming of A/D values to memory, and also to D/A outputs. This may facilitate time shifting and other device functions, but also may allow the readings to be transferred to a PC or other external device for further analysis. Additionally, the front end device 101 may be configured to play back previously recorded signals, or other signals placed into nonvolatile memory by the PC or other external device. Simultaneous playback of live data on some outputs 104, alongside recorded or synthetic data on other outputs 104 may be provided for in the same front end device 101.

The front end device 101 may include the ability to emulate the filtering and signal conditioning performed in off-the-shelf PLC equipment. For example, a user investigating signals using the INSTEON protocol may wish to enable the INSTEON emulation signal chain in the front end device 101. This may cause the device to emulate the characteristics of an INSTEON reference design receiver, and output the resulting signal to a D/A channel. This may allow the user to use the communications test equipment 106 to view the result of normal PLC equipment filtering. This output may be viewed in parallel with other signal paths, for example, signal paths with wider bandwidth, or other different characteristics. The emulation parameters may be loaded by the PC software, or programmed into the front end device 101 with fixed parameters.

Figure 9:
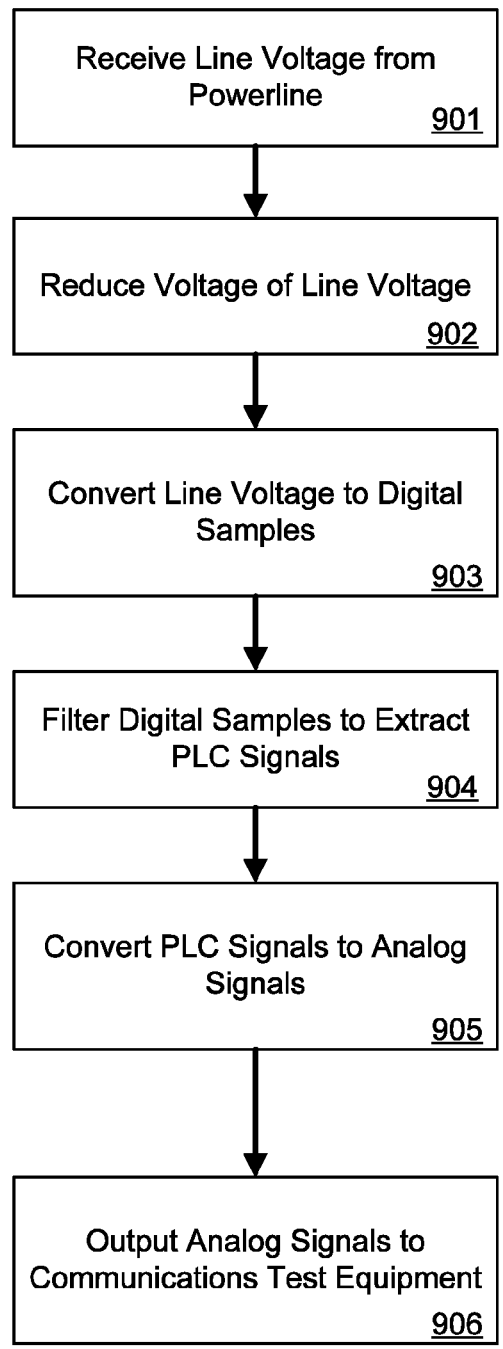
FIG. 9 depicts an exemplary procedure for analyzing PLC systems using a front end device.

FIG. 9 depicts an exemplary procedure for analyzing PLC systems using a front end device. In block 901, a line voltage may be received from a powerline. For example, the powerline 103 may be connected to the voltage input 102 of the front end device 101.

In block 902, the voltage of the line voltage may be reduced. For example, the front end device 101 may have a voltage reducer 202, such as a transformer or a pulse-withstanding divider resistor, connected to the voltage input 102. The line voltage may pass through the voltage reducer 202 and end up with a reduced voltage.

In block 903, the line voltage may be converted into digital samples. For example, the front end device 101 may have the A/D converter 301 connected to the voltage reducer 202. After the voltage of the line voltage has been reduced, the line voltage may be digitized by the A/D converter 301 and output as a digital signal with digital samples.

In block 904, the digital samples may be filtered to extract PLC signals. The line voltage may carry PLC signals for a PLC system. The digital samples created from the reduced voltage line voltage may be sent to the DSP 302, which may be connected to the A/D converter 301 in the front end device 101. The DSP 302 may apply any suitable filtering techniques to the digital samples to extract the PLC signals, or noise that may be of interest in analyzing a PLC system.

In block 905, the PLC signals may be converted into analog signals. The PLC signals extracted by the DSP 302 may be digital, as the PLC signals may be extracted from the digital samples. To allow the PLC signals to be analyzed by the communications test equipment 106, the front end device 101 may have the D/A converter 303 attached to the DSP 302. The D/A converter 303 may receive the digital PLC signals output by the DSP 302, and may convert the digital PLC signals to an analog signal. The analog signal may include the PLC signals in analog form.

In block 906, the analog signals may be output to communications test equipment. For example, the communications tests equipment 106 may be connected by the cable 105 to the output 104 of the front end device 101. The analog signal output from the D/A converter 303 may be sent to the output 104, where it may be received across the cable 105 at the communications test equipment 106. The communications test equipment 106 may then perform any suitable tests and analyses on the analog signal, and the PLC signals included in the analog signal.

As used herein, a "computer" or "computer system" may be, for example and without limitation, either alone or in combination, a personal computer (PC), server-based computer, main frame, server, microcomputer, minicomputer, laptop, personal data assistant (PDA), cellular phone, pager, processor, including wireless and/or wire line varieties thereof, and/or any other computerized device capable of configuration for receiving, storing and/or processing data for standalone application and/or over a networked medium or media. Examples of communication media that can be employed include, without limitation, wireless data networks, wire line networks, and/or a variety of networked media.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system. Memory may also include any means for storing software or other instructions including, for example and without limitation, a hard disk, an optical disk, floppy disk, DVD, compact disc, memory stick, ROM (read only memory), RAM (random access memory), PROM (programmable ROM), EEPROM (extended erasable PROM), and/or other like computer-readable media.

In general, computer-readable media may include any medium capable of being a carrier for an electronic signal representative of data stored, communicated or processed in accordance with embodiments of the present invention. Where applicable, method steps described herein may be embodied or executed as instructions stored on a computer-readable medium or media.

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these and other elements may be desirable. However, because such elements are well known in the art, and because they do not facilitate a better understanding of the present invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the present invention, a single component may be replaced by multiple components, and multiple components may be replaced by a single component, to provide an element or structure or to perform a given function or functions. Except where such substitution would not be operative to practice certain embodiments of the present invention, such substitution is considered within the scope of the present invention.

The examples presented herein are intended to illustrate potential and specific implementations of the present invention. It can be appreciated that the examples are intended primarily for purposes of illustration of the invention for those skilled in the art. The diagrams depicted herein are provided by way of example. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the following claims.

The invention is claimed as follows:

1. A method for testing and analyzing PLC systems using a safe powerline communications instrumentation front end device comprising:
   receiving a line voltage;
   reducing the voltage of the line voltage;
   extracting PLC signals from the line voltage; and
   outputting the PLC signals as analog signals for communications test equipment, wherein extracting PLC signals comprises:
      converting the line voltage to digital samples with an A/D converter;
      pre-processing the digital samples with an FPGA;
      processing the digital samples with a DSP;
      post-processing the digital samples with the FPGA; and
      converting the digital samples post-processed by the FPGA to an analog signal
   with a D/A converter.

2. The method of claim 1, further comprising:
converting the PLC signals to audio signals; and
outputting the audio signals from an audio output.

3. The method of claim 1, further comprising:
performing polyphase transformations on the PLC signals.

4. The method of claim 1, further comprising:
performing time domain masking on the PLC signals by selecting a pre-determined portion of the waveform and zeroing-out samples outside the pre-determined portion.

5. The method of claim 4, further comprising:
performing time warping on the PLC signals by creating a continuous time series out of only the pre-determined portions of the waveform.

6. The method of claim 1, further comprising:
superimposing a marker on the analog signals using the DSP by replacing samples at applicable spots with large values.

7. The method of claim 1, further comprising:
outputting a previously recorded or a generated synthetic waveform for comparison to the analog signals.

8. The method of claim 1, further comprising:
time buffering at least one of the line voltage, the PLC signals, and the analog signals by streaming the values to a memory buffer in the front end device allowing a user to pause, rewind, and replay signals.

9. The method of claim 1, further comprising:
pausing at least one of the line voltage, the PLC signals, and the analog signals.

10. The method of claim 1, further comprising:
recording at least one of the line voltage, the PLC signals, and the analog signals.

* * * * *